(12) United States Patent
Lunt et al.

(10) Patent No.: US 8,467,215 B2
(45) Date of Patent: Jun. 18, 2013

(54) PERMANENT SOLID STATE MEMORY

(75) Inventors: Barry M. Lunt, Provo, UT (US);
Matthew R. Linford, Provo, UT (US);
Robert C. Davis, Provo, UT (US); Dee Anderson, Provo, UT (US)

(73) Assignee: Brigham Young University, Provo, UT (US)

( * ) Notice: Subject to any disclaimer, the term of this patent is extended or adjusted under 35 U.S.C. 154(b) by 175 days.

(21) Appl. No.: 13/016,936

(22) Filed: Jan. 28, 2011

(65) Prior Publication Data

US 2011/0188285 A1 Aug. 4, 2011

Related U.S. Application Data

(60) Provisional application No. 61/299,927, filed on Jan. 29, 2010.

(51) Int. Cl.
*G11C 5/00* (2006.01)
*G11C 5/02* (2006.01)
*G11C 5/06* (2006.01)
*G11C 11/00* (2006.01)

(52) U.S. Cl.
USPC .............. 365/52; 365/51; 365/63; 365/148; 365/163

(58) Field of Classification Search
USPC ..................... 365/51, 52, 148, 163
See application file for complete search history.

(56) References Cited

U.S. PATENT DOCUMENTS

| | | | |
|---|---|---|---|
| 6,369,314 B1 * | 4/2002 | Nolas | 136/201 |
| 7,512,028 B2 | 3/2009 | Archibald et al. | |
| 7,923,813 B2 * | 4/2011 | Van Der Sluis et al. | 257/530 |
| 2005/0122798 A1 | 6/2005 | Lung et al. | |
| 2007/0058422 A1 * | 3/2007 | Phillips et al. | 365/158 |
| 2007/0087543 A1 | 4/2007 | Piebe et al. | |
| 2007/0262301 A1 * | 11/2007 | Cowburn et al. | 257/40 |
| 2008/0037324 A1 * | 2/2008 | Wen-Tai Shuy et al. | 365/185.05 |
| 2008/0158936 A1 | 7/2008 | Bertin et al. | |
| 2008/0316790 A1 | 12/2008 | Inoue et al. | |
| 2009/0168507 A1 | 7/2009 | Petti | |
| 2009/0180313 A1 | 7/2009 | Deweerd et al. | |
| 2010/0006924 A1 | 1/2010 | Chen et al. | |
| 2011/0006277 A1 * | 1/2011 | Kubo et al. | 257/2 |
| 2011/0044086 A1 * | 2/2011 | Schuette | 365/113 |

* cited by examiner

*Primary Examiner* — Ly D Pham
(74) *Attorney, Agent, or Firm* — Austin Rapp & Hardman

(57) ABSTRACT

A permanent solid state memory device is disclosed. Recording data in the permanent solid state memory device forms voids in a data layer between a first wire array and a second wire array. Wires of the first wire array extend transversely to wires in the second wire array. The data layer is at least partially conductive such that a voltage applied between a selected first wire in the first wire array and a selected second wire in the second wire array creates a heating current through the data layer at a data point between the first wire and the second wire. The heating current causes a data layer material to melt and recede to form a permanent void. Control elements are operably connected to apply voltages to predetermined combinations of wires to form permanent voids at data points throughout the solid state memory device.

26 Claims, 4 Drawing Sheets

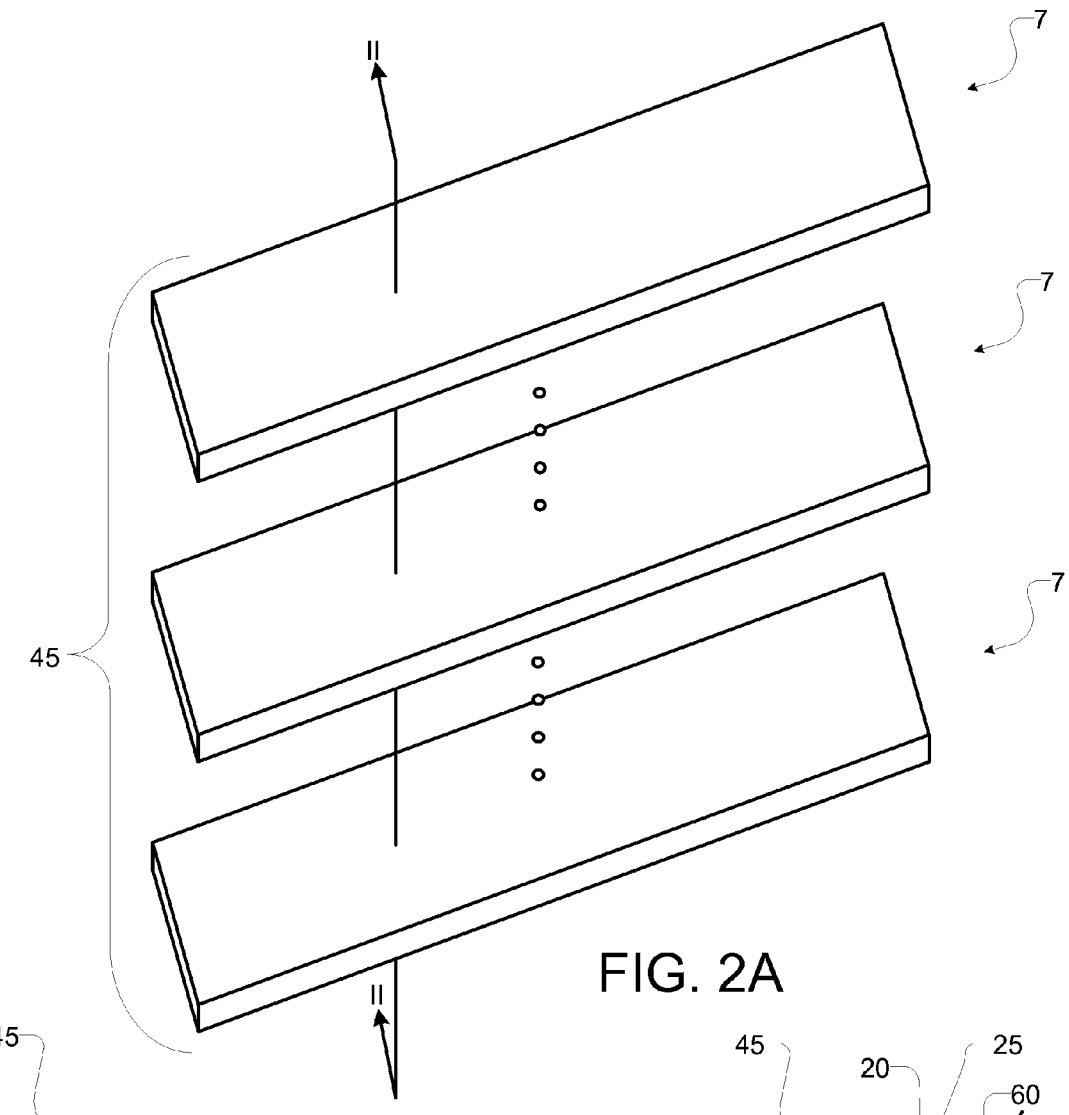
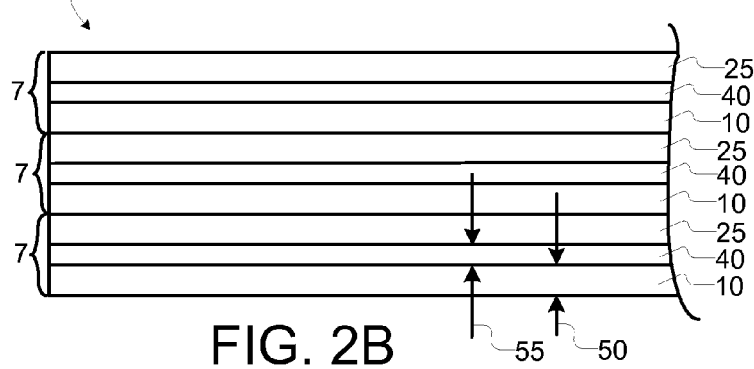
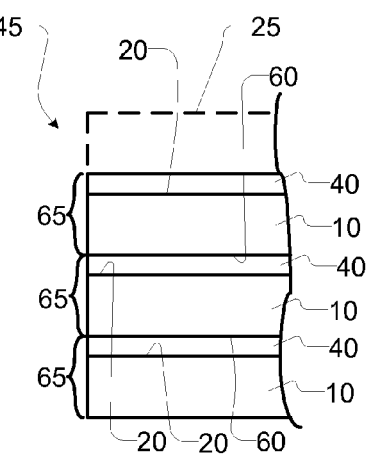
FIG. 2A
FIG. 2B
FIG. 2C

PERMANENT SOLID STATE MEMORY

CROSS REFERENCE TO RELATED APPLICATION

This application claims the benefit of U.S. Provisional Application Ser. No. 61/299,927 filed on Jan. 29, 2010, and titled "Permanent Solid State Memory," which is incorporated herein by reference in its entirety.

FIELD OF THE INVENTION

Embodiments of the present invention are directed generally to solid state memory devices, and more particularly to permanent solid state memory devices.

DESCRIPTION OF RELATED ART

Solid state memory devices enable storage of data by programming patterns of data points between one or more pairs of transversely extending line arrays. Computer systems including transistors and other control elements are used to apply voltages to predetermined combinations of lines to program the pattern of data points. These control elements also apply voltages to the lines in order to read data from the solid state memory devices. Several patent applications disclose a variety of solid state memory devices.

U.S. Patent Publication 2007/0087543 to Piebe published Apr. 19, 2007 is directed to a solid state memory device having fuses configured to be disposed between wire arrays. Programming this type of solid state memory device entails "blowing" a predetermined pattern of these fuses that enables reading digital information from the device. There are many conventional solid state memory devices having fuses interconnected between wires at data points in a form similar to the teachings of this publication.

U.S. Patent Publication 2009/0180313 to Deweerd et al. published Jul. 16, 2009 discloses a solid state device having anti-fuses between lines and electrodes instead of fuses. These anti fuses actually become more conductive when programmed, and thus provide the digital data through making these changes at a predetermined pattern of data points during programming.

U.S. Patent Publication 2009/0168507 to Petti published Jul. 2, 2009 is directed to a solid state memory device having wires in one layer connected to wires in another layer by diodes and/or anti fuses. Programming this type of solid state memory device entails "soft blowing" a predetermined pattern of these anti fuses and/or switching a diode that places the predetermined pattern of data points in a data state for providing digital information that can be read from the device.

U.S. Patent Publication 2008/0158936 to Bertin et al. published Jul. 3, 2008 has a specialized memory cell that has nanotube fabric material between terminals that forms a data point. This data point changes in resistance when programmed. Thus, a pattern of data points can be programmed to provide digital data.

U.S. Patent Publication 2005/0122798 to Lung et al. published Jun. 9, 2005 discloses another specialized memory cell between bit lines and word lines. The memory cell in this case utilizes a mechanism that combines layers by heating distinct layers and causing a chemical reaction that forms an alloy. The alloy has a different resistance as compared with the layers in their uncombined state. Thus, data points are created by forming alloys at selected locations between respective bit lines and word lines. The resulting pattern of data points provides digital data.

Most conventional solid state memory devices utilize discrete fuses or anti fuses at the data points. Programming by "blowing" fuses is an explosive process that leads to dendrites in regions around the data marks, which eventually leads to data loss. Most solid state memory is reversible. For example, non-volatile flash memory is reversible through reprogramming when a user deletes or replaces data in the flash memory. Even if the user does not delete or replace the data, flash memory will eventually lose data through loss of charge at the data points, typically after 10-12 years. Many specialized solid state memory devices are very complex with multiple layers and/or multiple elements forming terminals, fuses, etc. Accordingly, there exists a need for a simple solid state memory device that is not susceptible to dendrites, reprogramming, or other potential data loss mechanisms. There is a need for a simple permanent solid state memory device that has one or more data layer(s) in which permanent structural changes provide permanent, irreversible data marks in a solid state memory.

SUMMARY OF THE INVENTION

A permanent solid state memory device has a first wire array in a first layer and a second wire array in a second layer with a data layer disposed between the first layer and the second layer. Wires of the first wire array extend transversely to wires of the second wire array. The data layer spaces the first layer and the second layer at a distance approximately equal to a thickness of the data layer. The data layer is at least partially conductive such that a voltage applied between a selected first wire in the first array and a selected second wire in the second array creates a heating current through the data layer at a data point between the first wire and the second wire. The heating current causes a data layer material to melt and recede to form a permanent void. The heating current is directed through a predetermined pattern of data points in order to record data as a pattern of permanent voids in the permanent solid state memory device. Transistors and other control elements are used to apply the voltages to predetermined combinations of wires in order to control where the heating currents are directed. These control elements apply the voltages to form the permanent voids at specific data points throughout the solid state memory device, which are subsequently readable as digital data.

DESCRIPTION OF THE FIGURES

The following figures form part of the present specification and are included to further demonstrate certain aspects of the present invention. The invention may be better understood by reference to one or more of these figures in combination with the detailed description of specific embodiments presented herein.

FIG. 2A shows an exploded view of a stack of the permanent solid state devices of FIGS. 1A and 1B.

FIG. 2B shows a cross sectional view taken along line II-II of the stack of the permanent solid state devices of FIG. 2A in an assembled state in accordance with one embodiment.

FIG. 2C shows a cross sectional view taken along line II-II of the stack of the permanent solid state devices of FIG. 2A in an assembled state in accordance with another embodiment.

DETAILED DESCRIPTION OF THE INVENTION

Figure 1A:
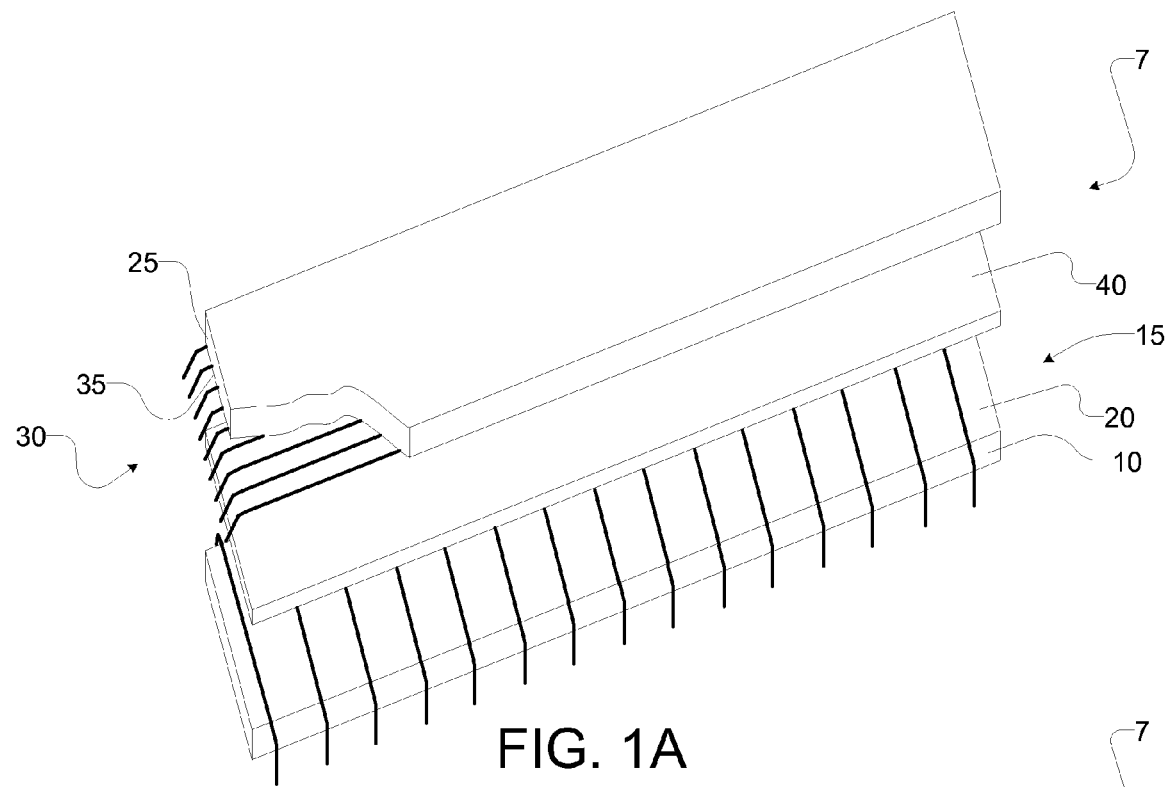
FIG. 1A shows an exploded perspective view of a permanent solid state memory device with transverse wire arrays on inner faces of each of a top substrate and a bottom substrate, and a data layer between the transverse wire arrays.

While compositions and methods are described in terms of "comprising" various components or steps (interpreted as meaning "including, but not limited to"), the compositions and methods can also "consist essentially of" or "consist of" the various components and steps, such terminology should be interpreted as defining essentially closed-member groups.

Materials

As described above, there is a need for a simple permanent solid state memory device. Whereas conventional solid state memory devices are typically reversible and susceptible to data loss, there is a need for a solid state memory device that enables permanent recording of data. Fuse type solid state memory devices are programmed by explosive processes of "blowing" fuses between wires of respective wire arrays. Such blowing of fuses creates optimal conditions for dendrites to grow, by relieving material in the vicinity of the blown fuses that can serve as starting material for the dendrites. Such dendrites may be worsened with exposure to high temperature or high humidity. Aside from the specific changes caused by recording to fuse type conventional solid state memory devices, fuse type and the other known solid state memory devices of the past are more complex, having terminals, specific fuse materials, antifuse materials, multiple layers, etc. Embodiments of the present invention, on the other hand, are simple in structure, permanent in duration of data storage, and physically irreversible.

In a simple form, a solid state memory device may include at least one first array of wires in a first layer and at least one second array of wires extending transversely relative to the first array of wires in a second layer. The first layer lies in a first plane, and the second layer lies in a second plane that is generally parallel to the first plane. In this embodiment, at least one data layer is disposed between the first layer and the second layer such that a voltage applied to a first wire in the first wire array and a second wire in the second wire array creates a current that heats the data layer at a location between the first wire and the second wire. The heating forms a data point that includes a void when data is written to the solid state memory device.

Embodiments include the data layer having at least one of a metal, a metal alloy, a metal oxide, or a metalloid. The data layer may include one or more material from among tellurium, tellurium alloys, selenium, selenium alloys, arsenic, arsenic alloys, tin, tin alloys, bismuth, bismuth alloys, antimony, antimony alloys, lead, lead alloys, germanium, germanium alloys, nickel, nickel alloys, chromium, chromium alloys, titanium, titanium alloys, stainless steel, gold, gold alloys, platinum, platinum alloys, palladium, palladium alloys, Monel, silicon, silicon alloys, copper, and copper alloys. In one embodiment, the data layer consists essentially of a tellurium, selenium, and bismuth alloy.

Examples of tellurium alloys include $Te_xSe_{100-x}$, $Te_xSe_{100-x}$ (where X is less than or equal to 95), $Te_{86}Se_{14}$, $Te_{79}Se_{21}$, $Te_xSb_{100-x}$, $Te_xSb_{100-x}$ (where X is less than or equal to 95), $Te_xSe_ySb_z$, $Te_xSe_ySb_x$ (where X+Y+Z=100), $Te_xSe_ySb_z$ (where X+Y+Z=100, Y is 10-30, and Z is 5-20), $Te_{75}Se_{20}Sb_5$, $Te_{72.5}Se_{20}Sb_{7.5}$, $Te_xSe_yIn_z$, $Te_xSe_yIn_z$ (where X+Y+Z=100), $Te_xSe_yIn_z$ (where X+Y+Z=100, Y is 10-30, and Z is 5-20), $Te_{75}Se_{20}In_5$, $Te_{72.5}Se_{20}In_{7.5}$, $Te_xSe_yPb_z$, $Te_xSc_yPb_z$ (where X+Y+Z=100), $TC_xSc_yPb_z$ (where X+Y+Z=100, Y is 10-30, and Z is 5-20), $Te_{75}Se_{20}Pb_5$, $Te_{72.5}Se_{20}Pb_{7.5}$, $Te_xSe_ySn_z$, $Te_xSe_ySn_z$ (where X+Y+Z=100), $Te_xSe_ySn_z$ (where X+Y+Z=100, Y is 10-30, and Z is 5-20), $Te_{75}Se_{20}Sn_5$, $Te_{72.5}Se_{20}Sn_{7.5}$, $TC_xSe_yBi_z$, $Te_xSe_yBi_z$ (where X+Y+Z=100), $Te_xSe_yBi_z$ (where X+Y+Z=100, Y is 10-30, and Z is 5-20), $Te_{75}Se_{20}Bi_5$, $Te_{72.5}Se_{20}Bi_{7.5}$, TeGeAs, TeGeSbS, $TeO_xGe$, $TeO_xSn$, Pb—Te—Sc, Pb—Te—Sb, As—Te, and Ge—Te. Examples of other alloys include As—Se, Ge—Se, GeS, SnS, Sb—S, $Bi_xSb_{100-x}$, $Bi_xSb_{100-x}$ (where X is less than or equal to 95). Other examples of alloys include GeS, $As_2S_3$, SnS, $Sb_2S_3$, $Sb_{20}S_{80}$, GeSe, $As_2Se_3$, SnSe, $Sb_2Se_3$, $Bi_2Se_3$, GeTe, $Ge_{10}Te_{90}$, $As_2Te_3$, SnTe, $Sb_2Te_3$, PbTe, $Bi_2Te_3$, $As_{10}Te_{90}$, $As_{32}Te_{68}$, $InTe_3$, $In_2S_3$, CdTe, and $In_2Se_3$.

Other examples of the data layer material include AuSn alloys (bulk melting point between 278° C. and 1064° C., depending on the percentage Sn content), AuSi alloys (bulk melting point between 1064° C. and 363° C., depending on the percentage Si content), AuGe alloys (bulk melting point between 1064° C. and 300° C., depending on the percentage Ge content), AuIn alloys (485° C. bulk melting point), CrO (197° C. bulk melting point), $CrO_2$ (400° C. bulk decomposition point), and $VO_2$ (1967° c. bulk melting point; 400° C. thin film melting point).

The data layer can further comprise at least one dopant. The dopant can be used to modulate or modify the thermal, resistive, optical, and stability profile of the data layer material.

The data layer can generally be any thickness. In one embodiment, the data layer has a thickness of about 3 nm to about 300 nm. A lower thickness limit can be about 2 nm. An upper thickness limit can be about 250 nm. Example thicknesses are about 2 nm, about 3 nm, about 4 nm, about 6 nm, about 8 nm, about 10 nm, about 12 nm, about 14 nm, about 16 nm, about 18 nm, about 20 nm, about 30 nm, about 40 nm, about 50 nm, about 60 nm, about 70 nm, about 80 nm, about 90 nm, about 100 nm, about I 10 nm, about 120 nm, about 130 nm, about 140 nm, about 150 nm, about 160 nm, about 170 nm, about t 80 nm, about t 90 nm, about 200 nm, about 210 nm, about 220 nm, about 230 nm, about 240 nm, about 250 nm, about 260 nm, about 270 nm, about 280 nm, about 290 nm, about 300 nm and ranges between any two of these values. The data layer may have a thickness of any value within this range. For example, the thickness of the data layer may be approximately 15 nm.

In some embodiments, the first wire and the second wire have a maximum dimension taken along a cross section generally perpendicular to a lengthwise extension of the wire in which the maximum dimension is about 30 nm to about 5000 nm. The first wire and the second wire may have a cross sectional area generally perpendicular to a lengthwise extension of the wires of about 900 nm$^2$ (30 nm×30 nm—minimum processing dimension squared) to about 25,000,000 nm$^2$. In some cases, the first wire and the second wire may have a minimum dimension that is smaller than the minimum process dimension. This can occur when the wires are formed of a thinner height dimension than the process dimension. For example, one or both wires could be deposited to a 2 nm to 5 nm thickness while having the process dimension width of 30 nm. In these cases, the cross sectional area of the wire(s) may be from 60 nm$^2$ to 150 nm$^2$.

Embodiments may include the first layer having a first substrate and the first wire array supported on the first substrate. The second layer may include a second substrate and the second wire array supported on the second substrate. In these embodiments, the first substrate is bonded to the second substrate with the data layer disposed between the first substrate and the second substrate. In other embodiments, multiple data layers and multiple wire arrays are disposed on opposing sides of the multiple data layers, wherein the multiple data layers are in respective layers between respective wire arrays. The number of data layers may be two, three, four, five, six, seven, eight, or more data layers with substrates having wire arrays on each side of the data layers.

With particular reference to the figures, FIG. 1A shows an exploded perspective view of a permanent solid state memory device 7. A first substrate 10 has a first wire array 15 supported on an upper surface 20 of the first substrate. A second substrate 25 has a second wire array 30 supported on a lower surface 35 of the second substrate 25. The wires of the first wire array 15 extend transversely and overlie the wires of the second wire array 30. The substrates 10, 25 and the wire arrays 15, 30 are oriented such that the wire arrays are on inner faces of each of top and bottom substrates 25, 10 and a data layer 40 is located between the wire arrays 15, 30.

Figure 1B:
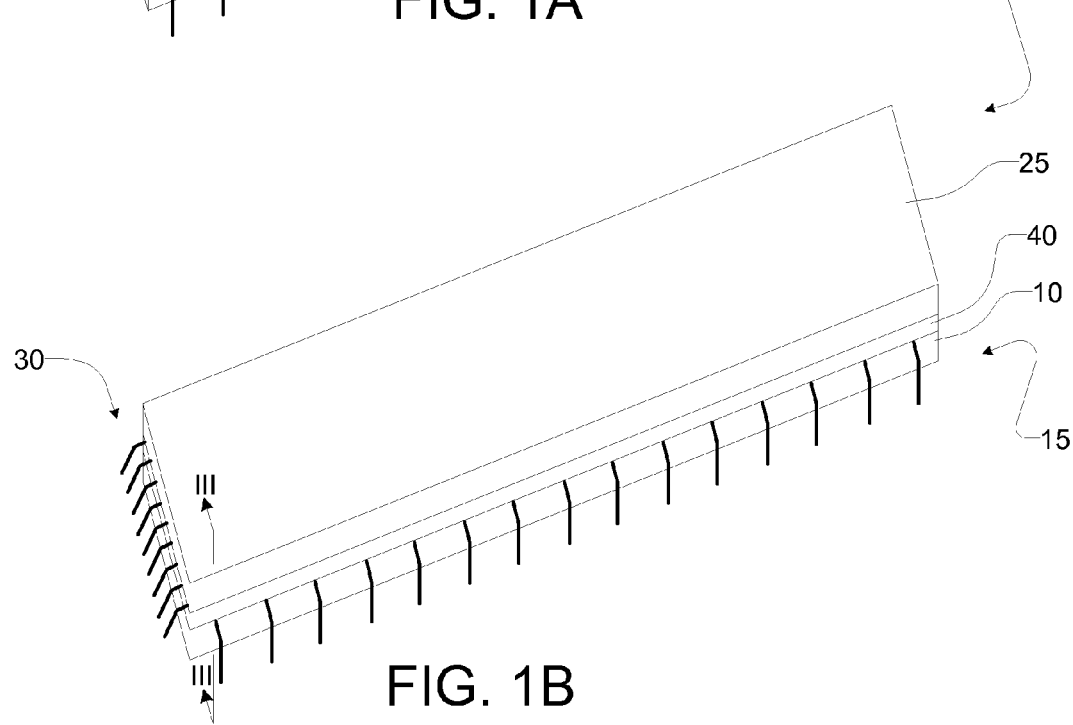
FIG. 1B shows an assembled perspective view of the permanent solid state memory device of FIG. 1A with the transverse wire arrays on inner faces of each of the top substrate and the bottom substrate, and a data layer between the transverse wire arrays.

FIG. 1B shows an assembled perspective view of the permanent solid state memory device 7 with the transverse wire arrays 15, 30 on inner faces of each of top substrate 25 and the bottom substrate 10. As shown, the data layer 40 is sandwiched between the transverse wire arrays 15, 30. The assembled permanent solid state memory device 7 may be integrated with any number of control elements in a system configured to read from and write to the permanent solid state memory device 7. These elements may include transistors, drivers, amplifiers, row and column sense amplifiers, etc. that function to select and apply voltages to the wires in the wire arrays in the proper sequence for writing and/or reading. These elements and the resulting system may include conventional elements and combinations, and/or elements and combinations that have not yet been developed without limitation.

Advantageously, the solid state memory device 7 could be made into three-dimensional storage without a related increase in power dissipation. For example, FIG. 2A shows an exploded view of a stack 45 of the permanent solid state devices 7 of FIGS. 1A and 1B. These devices 7 can be assembled into the composite device 45 that has multiple layers, each including transverse wires arrays and a data layer between the wire arrays.

FIG. 2B shows a cross sectional view taken along line II-II of the stack 45 of the permanent solid state devices 7 of FIG. 2A in an assembled state. In the example of FIG. 2B, each of the permanent solid state memory devices 7 that make up the composite device or stack 45 includes a first substrate 10, a data layer 40, and a second substrate 25. The data layer 40 is sandwiched between each respective pair of substrates 10, 25. An adhesive may be used to bond the devices 7 together to form the composite device 45. A thickness 50 of the substrates may be about ten nanometers to about ten micrometers. Another range for the thickness 50 is about ten nanometers to about one hundred nanometers. The thicknesses 50 may be any value in these ranges or outside these ranges. A thickness 55 of the data layer 40 may be in a range from about three nm to about three hundred nanometers. The thicknesses of the data layers 40 may be any value in this range or outside these ranges.

FIG. 2C shows a cross sectional view taken along line II-II of the stack 45 of the permanent solid state devices of FIG. 2A in an assembled state in accordance with another embodiment. In this embodiment, the first substrates 10 inside the stack 45 may have wire arrays 30 on respective lower surfaces 60 of the first substrates 10. The wire arrays 30 have wires that are oriented transverse to the wires of wire arrays 15 that are supported on the upper surfaces of the first substrates 10. In this way, the intermediate substrates 10 support the second wire arrays 30 as well as the first wire arrays 15, above and below each data layers 40. The stack 45, in this case, is built up by increments 65 that include a first substrate 10 and a data layer 40. The data layers 40 are adjacent to a wire array on the next superjacent first substrate 10 except for the uppermost data layer 40, which may be capped by a second substrate 25 (shown in dashed lines) similar to the second substrates 25 having the wire arrays 30 illustrated in FIGS. 1A and 1B. The stack 45 may be assembled in any manner and may include any number and combination of substrates and data layers that provides the first wire array 15, the data layer 40, and the second wire array 30 with wires transverse to the wires in the first wire array, in that order. Any number of devices may be stacked to provide the composite device or stack 45. The wires in the first wire array 15 may be generally perpendicular to wires in the second wire array 30, as shown in FIGS. 1A-1B. Alternatively, the wires in the first wire array 15 and the wires in the second wire array 30 may extend at any angle relative to each other while lying in generally parallel planes defined by the upper and lower surfaces of the substrates 10, 25.

Thus, the composite device 45 that is shown in FIGS. 2A-2C is an example of three-dimensional storage. Alternatively, another example of three-dimensional storage would be a single solid state device that includes multiple data layers. Because each data layer could extremely thin (e.g., 1 μm), such a solid state device could have many (e.g., 10 to 100, or possibly more) layers of storage. Thus, the density of storage in such a device could be many times greater than known solid state devices, which use only one layer.

Figure 3A:
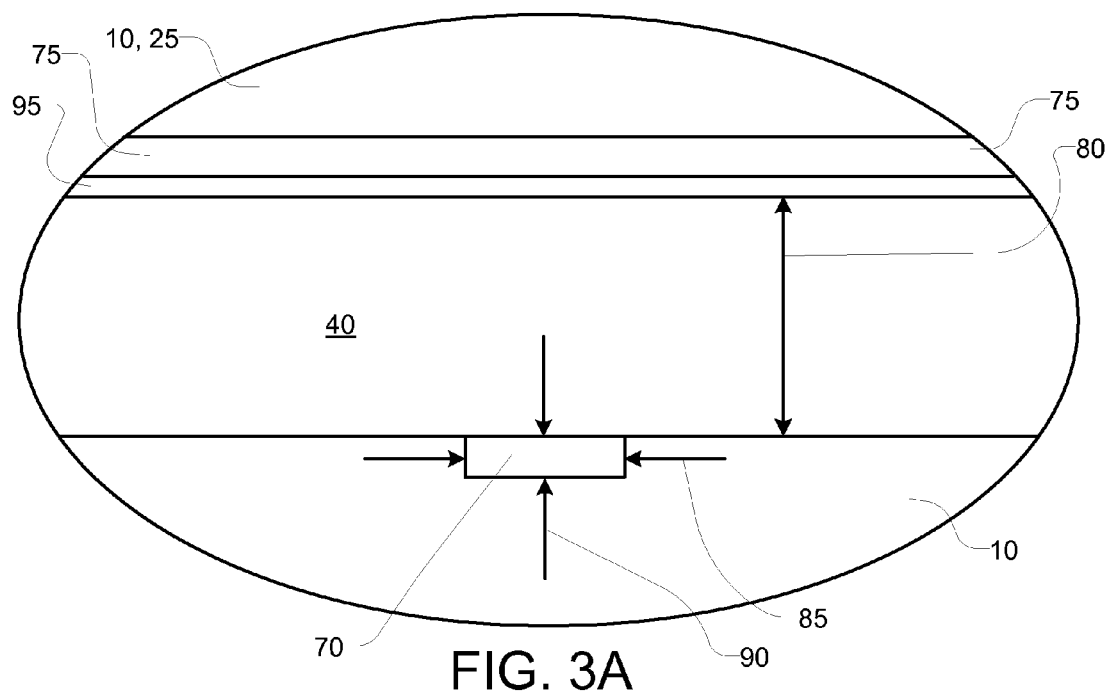
FIG. 3A shows a detailed cross sectional view taken along line III-III in FIG. 1B illustrating a data mark location in the data layer between a first wire supported on the first substrate and a second wire transverse to the first wire and supported on the second substrate prior to writing.

FIG. 3A shows a detailed cross sectional view of a portion of the composite device 45 taken along line III-III in FIG. 1B. This detailed sectional view illustrates a data mark location in the data layer 40 between a first wire 70 supported on the first substrate 10 and a second wire 75 transverse to the first wire 70 and supported on the second substrate 25 prior to writing. Alternatively, the second wire 75 may be supported on the lower surface 60 of another first substrate 10, as described with regard to FIG. 2C. As shown, the first wire 70 extends lengthwise out of the page. The second wire 75 extends side-to-side generally in the plane of the page. When a voltage is applied across these two wires, energy is concentrated in the at least partially conductive data layer 40 in a volume generally between the wires 70, 75. A thickness dimension 80 of the data layer is selected 70 generally provide the space between the first wire array and the second wire array 30, and thus generally the spacing between the first wire 70 and the second wire 75. This spacing may be selected based on the data layer material and the voltages to be applied to the wires 70, 75. A width dimension 85 and a height dimension 90 for the first wire 70 and the second wire 75 are selected to provide the needed capacity for voltages to be applied and the currents to be carried by the first wire 70 and the second wire 75. The material of the wires 70, 75 can be selected from among aluminum, copper, silver, gold, other metals, and combinations thereof without limitation. The first substrate 10 or the second substrate 25 with the second wire array 30 supported thereon may be bonded to the data layer 40 by an adhesive 95, as illustrated.

Figure 3B:
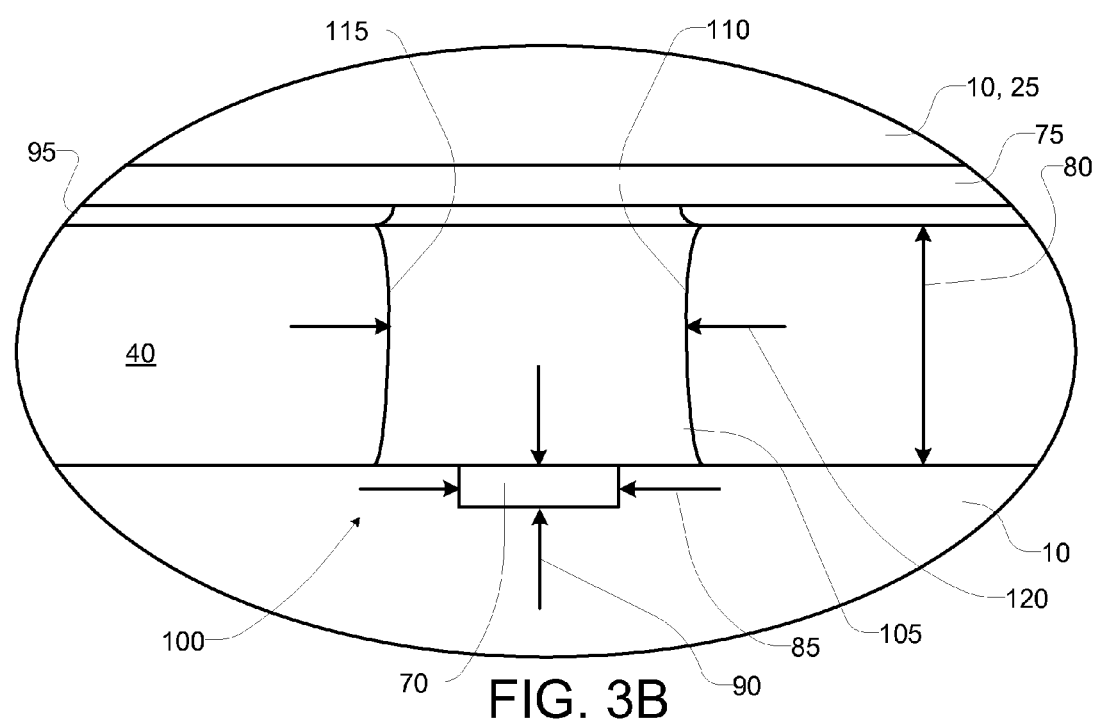
FIG. 3B shows a detailed cross sectional view taken along line III-III in FIG. 1B illustrating a data mark comprising a void in the data layer between the first wire supported on the first substrate and the second wire transverse to the first wire and supported on the second substrate after writing.

FIG. 3B shows a detailed cross sectional view taken along line III-III in FIG. 1B illustrating a data mark 100. The data mark includes a void 105 in the data layer 40 between the first wire 70 supported on a first substrate 10 and the second wire 75 that extends transverse to the first wire 70 and is supported on a second substrate 25 after writing. The second substrate 25 may be replaced by a first substrate 10 having a second wire array supported on a lower surface 60, as described with regard to FIG. 2C. As shown, the void 105 is formed when opposing inner walls 110, 115 recede away from each other. The created void 105 may have a width dimension 120.

Figure 4A:
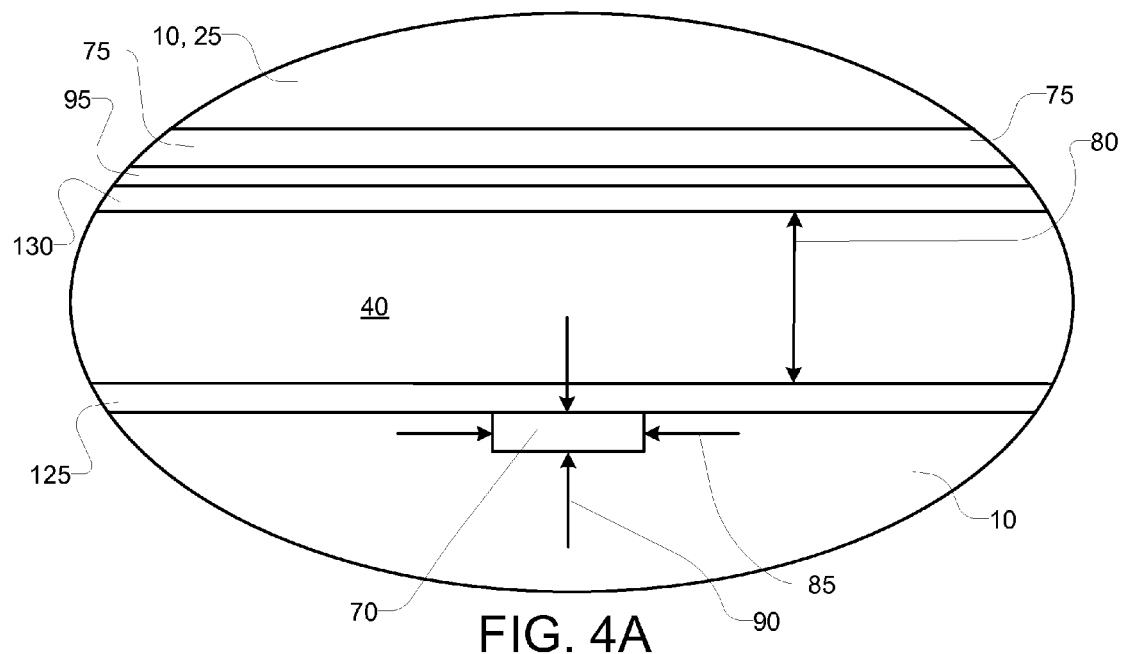
FIG. 4A shows a detailed cross sectional view taken along line III-III in FIG. 1B illustrating a data mark location in a carbon coated data layer between a first wire supported on the first substrate and a second wire transverse to the first wire and supported on the second substrate prior to writing.

Similar to FIG. 3A, FIG. 4A shows a detailed cross sectional view taken along line III-III in FIG. 1B for a different embodiment that includes carbon coatings 125, 130 on the data layer 40. in this embodiment, the data mark location is in the carbon coated data layer 40 between a first wire 70 supported on the first substrate 10 and a second wire 75 transverse to the first wire 70 and supported on the second substrate 25 prior to writing. As alternatively described, the second wires 75 may be supported on an underside of a next superjacent first substrate 10. The first carbon coating or layer 125 is disposed on the first substrate 10 and first wires 70. The first carbon coating or layer 125 may be in facial contact with the first wires 70 on an underside of the first carbon layer 125. The first carbon coating or layer 125 may also be in facial contact with the data layer 40 on a top side of the first carbon layer 125. A second carbon coating or carbon layer 130 may be placed atop the data layer 40 such that the second carbon layer 130 is in facial contact with the data layer on an underside of the second carbon layer. The second carbon layer 130 may receive the second wires 75 and the second substrate 25 in overlying relation. An intervening layer of adhesive 95 may bond the second carbon layer 130 to the second wires 75 and the second substrate 25. Other variations are also possible. For example, the adhesive layer 95 could be placed between the second carbon layer 130 and the adhesive layer 40 or between any two layers without limitation. Furthermore, the second substrate 25 could be replaced by a next superjacent first substrate 10, as described in alternative configurations. Since carbon is a conductor, the first carbon layer 125 and second carbon layer 130 may act as conductor for current traveling between the first wires 70 and the data layer 40, and the second wires 75 and the data layer 40. Depending on the data layer material, the carbon layers 125, 130 or other generally conductive coupling layers may be incorporated. Such carbon layers 125, 130 or other coupling layers may facilitate de-wetting and thus promote void formation.

Figure 4B:
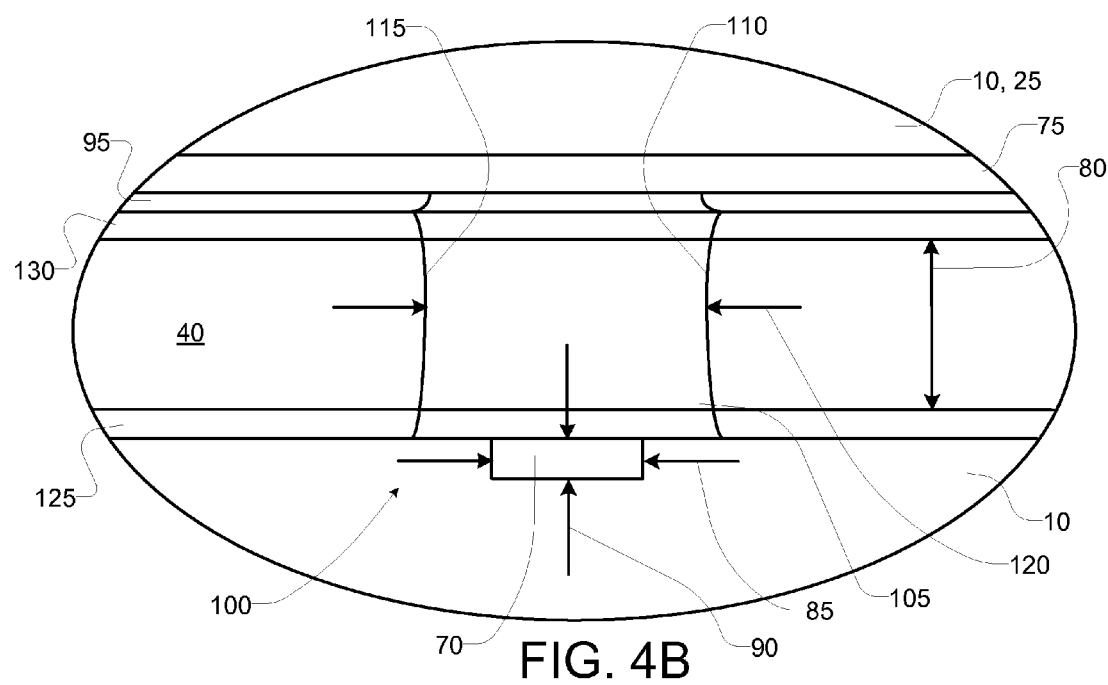
FIG. 4B shows a detailed cross sectional view taken along line III-III in FIG. 1B illustrating a data mark comprising a void in the carbon coated data layer between the first wire supported on the first substrate and the second wire transverse to the first wire and supported on the second substrate after writing.

Similar to FIG. 3B, FIG. 4B shows a post write detailed cross sectional view taken along line III-III in FIG. 1B for the stack of layers shown in the embodiment of FIG. 4A. Thus, the embodiment of FIG. 4B illustrates a data mark 100 comprising a void 105 in the carbon coated data layer 40 between the first wire 70 supported on the first substrate 10 and the second wire 75 transverse to the first wire 70 and supported on the second substrate 25 after writing. It is to be understood that the second wires 75 may alternatively be supported on an underside of a next superjacent first substrate 10. The first carbon layer 125 and the second carbon layer may help the data layer material to recede during writing when a heating current is passed through the data layer 40 via the first wires 70 and the second wires 75.

The data storage mechanism described herein is substantially different from existing technologies for non-volatile memory, including flash memory, UVEPROM, EEPROM, EPROM and PROM. All of these technologies store data as a charge on a floating gate, or as a fuse which has been blown. An electromagnetic pulse (EMP) event would destroy all of the devices that store data on existing non-volatile memory. Advantageously, however, an EMP event should have essentially no effect on a permanent solid state memory device made in accordance with the present disclosure. Although control elements in a system configured to read from and write to the permanent solid state memory device would not be immune to an EMP event, the control elements could be EMP hardened in accordance with radiation-hardening techniques.

Methods of Preparation

A simple form of preparing a solid state memory device includes providing at least one first substrate with a first wire array disposed thereon and depositing at least one data material on the first wire array and the first substrate. This embodiment includes providing at least one second substrate with a second wire array disposed thereon and applying the second substrate to the data material such that the data material is between the first wire array and the second wire array. In this embodiment, a first wire in the first wire array and a second wire in the second wire array are configured to apply a voltage of about 1 Volt to about 15 Volts between the first wire and the second wire. Also in this embodiment, the data material is configured to melt and recede away from a data point between the first wire and the second wire when the voltage is applied and the data material is heated by a resulting current to a melting temperature of about 150° C. to about 1500° C. In one embodiment, the data material is configured to melt and recede away from the data point when the data material is heated to a melting temperature of about 600° C. to about 700° C.

Embodiments of preparing a solid state memory device include depositing wire arrays on the substrates on surfaces configured to sandwich the data layer between the wire arrays with the wires in one wire array extending transverse to the wires in the other wire array. The materials of the data layer may include at least one metal, metal alloy, or metalloid. The data layer may include materials from among tellurium, tellurium alloys, selenium, selenium alloys, arsenic, arsenic alloys, tin, tin alloys, bismuth, bismuth alloys, antimony, antimony alloys, lead, lead alloys, germanium, germanium alloys, nickel, nickel alloys, chromium, chromium alloys, titanium, titanium alloys, stainless steel, gold, gold alloys, platinum, platinum alloys, palladium, palladium alloys, Monel, silicon, silicon alloys, copper, and copper alloys. The method of preparing the permanent solid state memory device may include depositing one of these materials or any other material listed herein. In one embodiment, depositing the data material comprises depositing a tellurium, selenium, and bismuth alloy on the first substrate.

Deposition of the wire arrays may include one or more steps from among sputtering, evaporation, chemical vapor deposition, pulsed laser deposition, and molecular beam epitaxy. A continuous layer may be applied to a substrate surface that includes grooves patterned in a configuration corresponding to the desired wire array. Then, substantially all of the continuous layer except for the material that was deposited in the grooves may be removed. In this way, the wire arrays remain on the substrate in the patterned grooves.

The step of depositing the data material may include depositing the data material by one of sputtering, evaporation, chemical vapor deposition, pulsed laser deposition, and molecular beam epitaxy to a thickness of about 2 nm to about 300 nm on the first substrate. Thicknesses outside this range or within this range may be deposited. In one example, the depositing step includes depositing the data layer material to a thickness of about 15 nm. Providing the first substrate may include depositing the first wire array on the first substrate. Providing the second substrate may include depositing the second wire array on the second substrate. The second substrate or another first substrate having the second wire array on its lower surface may be bonded to the data layer by an adhesive.

In one embodiment, the method includes placing a carbon or other material coupling layer as an intervening layer between the data layer and the wire arrays. Placing the coupling layer may comprise any of the deposition steps described for depositing the data layer. The coupling layer(s) may be deposited on the first substrate and the first wire array, the second substrate and the second wire array, and/or on either face of the data layer without limitation.

Additional embodiments of the invention are directed towards methods of preparing a system for reading and/or writing data to a permanent solid state memory device. As such, the methods of preparing may include assembling various control elements including transistors, drivers, amplifiers, row and column sense amplifiers, etc. that function to select and apply voltages to the wires in the wire arrays in the proper sequence for writing to and/or reading digital data from the permanent solid state memory device. These elements and the resulting system may include conventional elements and combinations and/or elements and combinations that have not yet been developed without limitation.

Methods of Use

In a simple form, using a solid state memory device includes providing at least one first layer with a first wire array disposed therein, and providing at least one second layer with a second wire array disposed therein. Using the solid state memory device also includes applying a voltage across a first wire of a first wire array in a first layer and a second wire of a second wire array in a second layer. In this embodiment, using the solid state memory device includes heating a data layer between the first layer and the second layer by the applying step. This embodiment includes melting a data layer material in the data layer and causing the data layer material to recede from a location between the first wire and the second wire. Melting in this manner forms receded walls and a data point comprising a void within the receded walls of the data layer material.

In one embodiment, the melting step comprises creating a data point including a void between the receded walls of data material in which the walls are spaced about 30 nm to about 5000 nm from each other on opposite sides of the data point.

In accordance with some embodiments, the applying step includes applying a voltage of about 1 Volt to about 15 Volts. In other embodiments, the applying step includes applying a voltage of about 2.5 Volts to about 6 Volts. Applying a voltage in this way creates a current through the data layer, which is somewhat resistive and therefore undergoes resistive heating. Some embodiments include thus resistively heating a portion of the data layer to a temperature of about 150° C. to about 1500° C. Other embodiments, include heating a portion of the data layer to a temperature of about 600° C. to about 700° C.

In one embodiment of the present invention, the method includes using a computer that is operably connected to the various control elements including transistors, drivers, amplifiers, row and column sense amplifiers, etc. that function to select and apply voltages to the wires in the wire arrays in the proper sequence for writing and/or reading. When reading the data, one conductivity through the data layer at the data point exists before the void forms and a different conductivity is created and exists after the void forms. One of the advantages of the permanent solid state memory device is that it enables very high data densities. Also, the readout may be parallel and very fast.

A write strategy may be provided in the control elements for adjusting the voltages and resulting currents through the data layer during writing. Voltages may be varied to provide the energy that is needed while protecting the data layer and other nearby elements of the permanent solid state memory device during recording of data. For example, higher voltages and currents may be needed at the beginning of writing a data point while lower voltages and currents may be needed as the void of the data point begins to form. In one example, modulation of the voltage/current may be provided under electronic control using a computer, software, and/or firmware in order to avoid overheating at the data points.

All of the compositions and/or methods and/or processes and/or apparatus disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and/or apparatus and/or processes and in the steps or in the sequence of steps of the methods described herein without departing from the concept and scope of the invention. More specifically, it will be apparent that certain agents which are both chemically and physically related may be substituted for the agents described herein while the same or similar results would be achieved. All such similar substitutes and modifications apparent to those skilled in the art are deemed to be within the scope and concept of the invention.

What is claimed is:

1. A solid state memory device, comprising:
   at least one first array of wires in a first layer that lies in a first plane;
   at least one second array of wires extending transverse to the first array of wires in a second layer that lies in a second plane, wherein the first plane is generally parallel to the second plane; and
   at least one data layer disposed between the first layer and the second layer such that a voltage applied to a first wire in the first array and to a second wire in the second array heats the data layer at a location between the first wire and the second wire and forms a data point comprising a void when data is written to the solid state memory device;
   wherein the first layer comprises a first substrate and the first wire array supported on the first substrate;
   wherein the second layer comprises a second substrate and the second wire array supported on the second substrate; and
   wherein the first substrate is bonded to the second substrate with the data layer disposed between the first substrate and the second substrate.

2. The solid state memory device of claim 1, wherein the data layer comprises at least one of a metal, a metal alloy, a metal oxide, and a metalloid.

3. The solid state memory device of claim 1, wherein the data layer comprises at least one material from among tellurium, tellurium alloys, selenium, selenium alloys, arsenic, arsenic alloys, tin, tin alloys, bismuth, bismuth alloys, antimony, antimony alloys, lead, lead alloys, germanium, germanium alloys, nickel, nickel alloys, chromium, chromium alloys, titanium, titanium alloys, stainless steel, gold, gold alloys, platinum, platinum alloys, palladium, palladium alloys, Monel, silicon, silicon alloys, copper, and copper alloys.

4. The solid state memory device of claim 1, wherein the data layer consists essentially of a tellurium, selenium, and bismuth alloy.

5. The solid state memory device of claim 1, wherein the data layer has a thickness of about 3 nm to about 300 nm.

6. The solid state memory device of claim 1, wherein the first wire and the second wire have a maximum dimension taken along a cross section generally perpendicular to a lengthwise extension of the wire of about 30 nm to about 5000 nm.

7. The solid state memory device of claim 1, wherein the first wire and the second wire have a cross sectional area generally perpendicular to a lengthwise extension of the wires of about 900 $nm^2$ to about 25,000,000 $nm^2$.

8. The solid state memory device of claim 1, wherein the solid state memory device is immune to an electromagnetic pulse event.

9. A solid state memory device, comprising:
   at least one first array of wires in a first layer that lies in a first plane;
   at least one second array of wires extending transverse to the first array of wires in a second layer that lies in a second plane, wherein the first plane is generally parallel to the second plane;
   at least one data layer disposed between the first layer and the second layer such that a voltage applied to a first wire in the first array and to a second wire in the second array heats the data layer at a location between the first wire and the second wire and forms a data point comprising a void when data is written to the solid state memory device;
   a first intervening coupling layer between the first array of wires and the data layer; and
   a second intervening coupling layer between the second array of wires and the data layer.

10. A solid state memory device, comprising:
    at least one first array of wires in a first layer that lies in a first plane;
    at least one second array of wires extending transverse to the first array of wires in a second layer that lies in a second plane, wherein the first plane is generally parallel to the second plane;
    at least one data layer disposed between the first layer and the second layer such that a voltage applied to a first wire in the first array and to a second wire in the second array heats the data layer at a location between the first wire and the second wire and forms a data point comprising a void when data is written to the solid state memory device; and
    multiple data layers and multiple wire arrays disposed on opposing sides of the multiple data layers, wherein the multiple data layers are in respective layers between respective wire arrays.

11. A method of using a solid state memory device, the method comprising:
    providing at least one first layer with a first wire array disposed therein;
    providing at least one second layer with a second wire array disposed therein;
    applying a voltage across a first wire of a first wire array in a first layer and a second wire of a second wire array in a second layer;
    heating a data layer between the first layer and the second layer by the applying step; and
    melting a data layer material in the data layer and forming a data point comprising a void in the data layer material;
    wherein the melting step comprises creating a data point having a void between the receded walls of data material, wherein the walls are spaced about 30 nm to about 5000 nm from each other on opposite sides of the data point.

12. A method for preparing a solid state memory device, the method comprising:
    providing at least one first substrate with a first wire array disposed thereon;
    depositing at least one data material on the first substrate;
    providing at least one second substrate with a second wire array disposed thereon;
    applying the second substrate to the data material such that the data material is between the first wire array and the second wire array;
    wherein:
       a first wire in the first wire array and a second wire in the second wire array are configured to apply a voltage of about 1 Volt to about 15 Volts between the first wire and the second wire; and
       the data material is heated to a melting point temperature of about 150° C. to about 1500° C.

13. The method of claim 12, wherein the data material is configured to melt and recede away from a data point between the first wire and the second wire when the voltage is applied.

14. The method of claim 12, wherein the data material is configured to melt and recede away from the data point when the data material is heated to a temperature of about 600° C. to about 700° C.

15. The method of claim 12, wherein depositing the data material comprises depositing at least one of a metal, a metal alloy, a metal oxide, and a metalloid.

16. The method of claim 12, wherein depositing the data material comprises depositing at least one material from among tellurium, tellurium alloys, selenium, selenium alloys, arsenic, arsenic alloys, tin, tin alloys, bismuth, bismuth alloys, antimony, antimony alloys, lead, lead alloys, germanium, germanium alloys, nickel, nickel alloys, chromium, chromium alloys, titanium, titanium alloys, stainless steel, gold, gold alloys, platinum, platinum alloys, palladium, palladium alloys, Monel, silicon, silicon alloys, copper, and copper alloys.

17. The method of claim 12, wherein depositing the data material comprises depositing a tellurium, selenium, and bismuth alloy on the first substrate.

18. The method of claim 12, wherein depositing the data material comprises depositing the data material to a thickness of about 3 nm to about 300 nm on the first substrate.

19. The method of claim 12, wherein providing the first substrate comprises depositing the first wire array on the first substrate.

20. The method of claim 12, wherein providing the second substrate comprises depositing the second wire array on the second substrate.

21. The method of claim 12, further comprising:
applying a first coupling layer between the first wire array and the first substrate; and
applying a second coupling layer between the second wire array and the second substrate.

22. A method of using a solid state memory device, the method comprising:
providing at least one first layer with a first wire array disposed therein;
providing at least one second layer with a second wire array disposed therein;
applying a voltage across a first wire of a first wire array in a first layer and a second wire of a second wire array in a second layer;
heating a data layer between the first layer and the second layer by the applying step; and
melting a data layer material in the data layer and forming a data point comprising a void in the data layer material;
wherein the melting step comprises causing the data layer material to recede from a location between the first wire and the second wire, forming receded walls and the void within the receded walls in the data layer material.

23. The method of claim 22, wherein the applying step comprises applying a voltage of about 1 Volt to about 15 Volt.

24. The method of claim 22, wherein the applying step comprises applying a voltage of about 2.5 Volt to about 6 Volts.

25. The method of claim 22, wherein the heating step comprises heating a portion of the data layer to a temperature of about 150° C. to about 1500° C.

26. A method of using a solid state memory device, the method comprising:
providing at least one first layer with a first wire array disposed therein;
providing at least one second layer with a second wire array disposed therein;
applying a voltage across a first wire of a first wire array in a first layer and a second wire of a second wire array in a second layer;
heating a data layer between the first layer and the second layer by the applying step; and
melting a data layer material in the data layer and forming a data point comprising a void in the data layer material;
wherein the heating step comprises heating a portion of the data layer to a temperature of about 600° C. to about 700° C.

* * * * *